US010088511B2

United States Patent
Nahmanny et al.

(10) Patent No.: US 10,088,511 B2
(45) Date of Patent: Oct. 2, 2018

(54) ESTIMATION OF COMPLEX ANTENNA IMPEDANCE USING SCALAR MEASUREMENTS

(71) Applicant: Intel IP Corporation, Santa Clara, CA (US)

(72) Inventors: Danniel Nahmanny, Givat Shapira (IL); Fabian Cossoy, Atlit (IL)

(73) Assignee: Intel IP Corporation, Santa Clara, CA (US)

( * ) Notice: Subject to any disclaimer, the term of this patent is extended or adjusted under 35 U.S.C. 154(b) by 286 days.

(21) Appl. No.: 14/870,000

(22) Filed: Sep. 30, 2015

(65) Prior Publication Data

US 2017/0089967 A1 Mar. 30, 2017

(51) Int. Cl.
*G01R 33/02* (2006.01)
*G01R 31/00* (2006.01)
*G01R 27/28* (2006.01)
*G01R 27/06* (2006.01)
*G01R 29/10* (2006.01)

(52) U.S. Cl.
CPC ............ *G01R 27/28* (2013.01); *G01R 27/06* (2013.01); *G01R 29/10* (2013.01)

(58) Field of Classification Search
CPC ......... G01R 27/28; G01R 27/06; G01R 29/10
USPC .................................. 324/258, 638, 750.16
See application file for complete search history.

(56) References Cited

U.S. PATENT DOCUMENTS

2014/0022556 A1* 1/2014 Bruno .................... B41J 19/205
356/614

OTHER PUBLICATIONS

Cesar Sanchez-Perez et al. (Aragon Institute of Engineering Research, Universidad de Zaragoza, 50018 Spain, 2011 IEEE).*
Cesar Sanchez-Perez et al. "Load Impedance Estimation for Fast and Accurate Configuration of Tunable Matching Networks".*
Extended/Supplementary European Search Report received for European Patent Application No. 16185994.7, dated Feb. 10, 2017, 6 pages.
Sanchez-Perez et al., "Load Impedance Estimation for Fast and Accurate Configuration of Tunable Matching Networks", Microwave Symposium Digest (MTT), 2011 IEEE MTT-S International, IEEE, Jun. 5, 2011, pp. 1-4.

* cited by examiner

*Primary Examiner* — Farhana Hoque
(74) *Attorney, Agent, or Firm* — Schiff Hardin LLP

(57) ABSTRACT

Described herein are architectures, platforms and methods for deriving a complex antenna impedance based on scalar measurements. Three significantly different electrical characterizations such as scattering parameter (S-parameter) settings that correspond to at least three perturbation applications may facilitate the derivation of the complex antenna impedance at an output port antenna load plane ( $\Gamma_L$ plane).

19 Claims, 5 Drawing Sheets

Portable Device 102
Processor(s) 200
Storage 202
Application(s) 204
110-2
Transmitter PA 206
Matching Circuit 208
Directional Coupler 210
Scalar Measurement Detector(s) 212
Γin 218
Coupler-Antenna Interface Circuit 222
Switchable Controlled Block 214
Front-End Module 216
$\Gamma_L$ 220
104

ESTIMATION OF COMPLEX ANTENNA IMPEDANCE USING SCALAR MEASUREMENTS

BACKGROUND

An increasing number of wireless communication standards as applied to a device and a trend towards ever smaller, slimmer and lighter devices may cause major design challenges for antenna or antennas (hereinafter referred to as antenna in this document). The antenna represent a category of components that may fundamentally differ from other components in the device. For example, the antenna may be configured to efficiently radiate in free space, whereas the other components are more or less isolated from their surroundings.

Impedance matching or antenna matching, for example, in antenna designs is typically implemented to remove a mismatch loss. That is, a power reflected from a load or the antenna to a power source is minimized while the power that is delivered to the load or the antenna is maximized. In this example, a power detection is implemented to measure transmission power, transmission losses, and the like, in a circuitry of the device.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Described herein are architectures, platforms and methods for measuring a complex antenna impedance parameter based upon measured scalar measurements in a transceiver power detection circuitry of a device.

For example, the transceiver power detection circuitry includes a directional coupler and a scalar measurement detector that samples and measures, respectively, a scalar component of a power reflection coefficient during data transmission at high frequencies. In this example, a processor is configured to perform an algorithm to plot the scalar measurement from an input port reflection coefficient plane ($\Gamma_{in}$ plane) to an output port antenna load plane ($\Gamma_L$ plane).

By using a direct and inverse transformation, the processor may be further configured to plot at the $\Gamma_L$ plane an equivalent scalar measurement graph (e.g., circle) that contains an unknown complex point (i.e., $\Gamma_L$).

As described herein, the scalar measurement may correspond to a particular setting of a switchable controlled block component, which realizes a particular circuit perturbation (i.e., electrical characterization) of a Coupler-Antenna interface circuit. The electrical characterization of the Coupler-Antenna interface circuit may be represented, for example, by its S-Parameter matrix. Each S-parameter matrix set of the Coupler-Antenna interface circuit may correspond to the scalar measurement performed by the scalar measurement detector. In this example, at least three plots in the $\Gamma_L$ plane may define an intersection point that indicates the unknown complex point $\Gamma_L$.

Based from the derived scalar measurements, the derived unknown complex point $\Gamma_L$ and the measured power at the $\Gamma_{in}$ plane (Pin) measured by the scalar power detector i.e., Pin $\propto$ ($P_f$–$P_r$), an accurate estimation of radiated or transmitted power at the antenna ($P_L$) may be implemented. For example, the transmitted power at the antenna—$P_L$ may be calculated by using the foregoing derived values of $\Gamma_L$ in following equations:

$$\Gamma_{in} = S_{11} + \frac{S_{12}S_{21}\Gamma_L}{1 - S_{22}\Gamma_L} \quad \text{Eq. 1}$$

$$G_p = \frac{P_L}{P_{in}} = \frac{|S_{21}|^2}{|1 - S_{22}\Gamma_L|^2} \cdot \frac{1 - |\Gamma_L|^2}{1 - |\Gamma_{in}|^2} \quad \text{Eq. 2}$$

Furthermore, based on the derived unknown complex point $\Gamma_L$, another matching adjustment of an output power amplifier as further discussed in detail below may be implemented.

Figure 1:
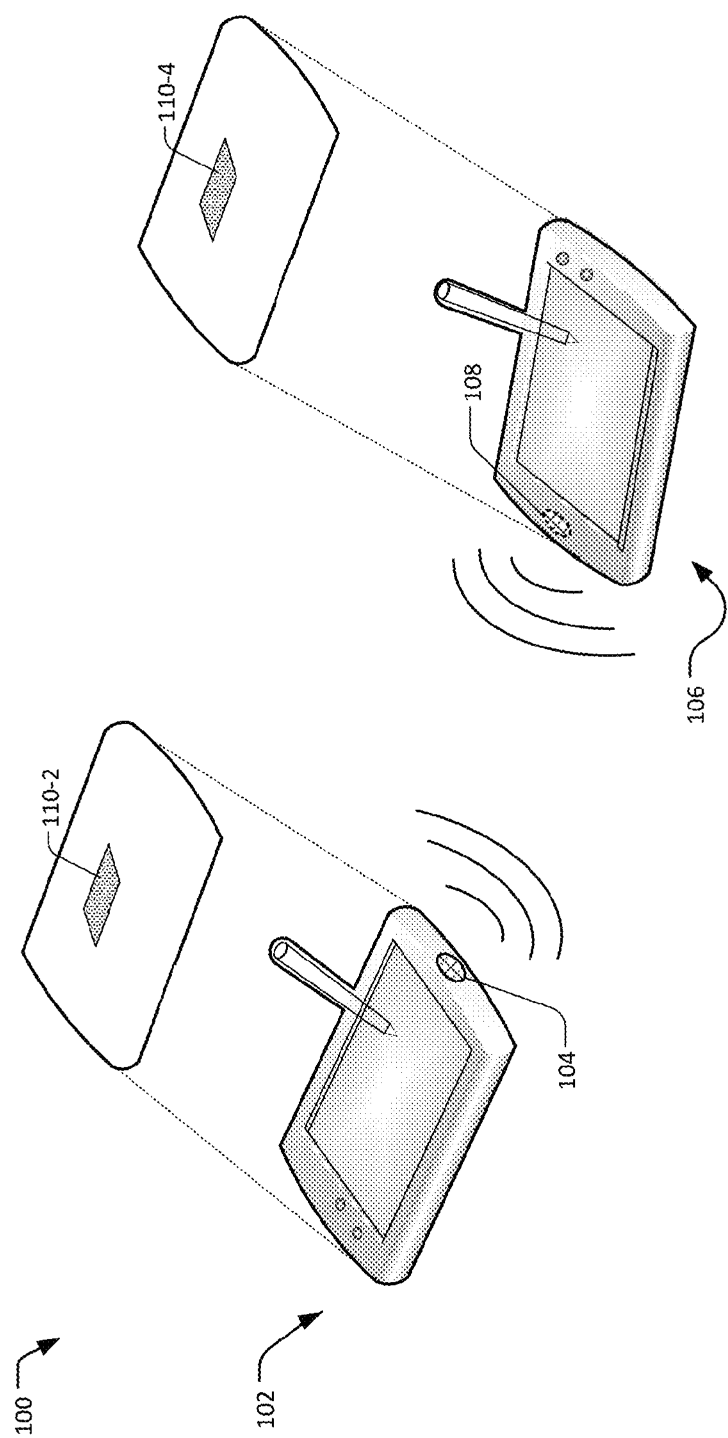
FIG. 1 is an example scenario that utilizes a transceiver power detection circuitry in a system of a device.

FIG. 1 is an example scenario 100 that utilizes a transceiver power detection circuitry in a system of a device. The scenario 100 shows a device 102 with an antenna 104, and another device 106 with an antenna 108. Furthermore, the scenario 100 illustrates a transceiver power detection circuitry 110 for each device 102 and 106 for purposes of illustrating implementations described herein.

The devices 102 or 106 may include, but is not limited to, a tablet computer, a netbook, a notebook computer, a laptop computer, mobile phone, a cellular phone, a smartphone, a personal digital assistant, a multimedia playback device, a digital music player, a digital video player, a navigational device, a digital camera, and the like.

The device 102, for example, may communicate with the other device 106 in a network environment. The network environment, for example, includes a cellular network configured to facilitate communications between the devices 102 and 106 using a base station (not shown). During this cellular network communications, an accurate measurement of transmitted power at the antenna 104, for example, may be implemented by the transmitting device 102 through its transceiver power detection circuitry 110-2. In this example, the transceiver power detection circuitry 110-2 utilizes a scalar measurement to determine a complex gamma load or unknown complex point $\Gamma_L$ as further discussed below.

As described herein, the transceiver power detection circuitry 110 may include a configuration similar to a double-port network, for example, where the scalar measurement is implemented at the input port side, while the measurement of the unknown complex point $\Gamma_L$ is implemented at the output port side. In between these two ports are a switchable controlled block (not shown) and a front-end module (not shown) whose physical presence may facilitate mapping of the unknown complex point $\Gamma_L$ into a different power reflection coefficient ($\Gamma_{in}$) as seen at the input port side.

Using a direct and inverse transformation, a processor component (not shown) may plot the scalar measurement from the input port reflection coefficient plane ($\Gamma_{in}$ plane) to the output port antenna load plane ($\Gamma_L$ plane). The plotted scalar measurement at the $\Gamma_L$ plane, for example, may include the unknown complex point $\Gamma_L$.

In an implementation, an iteration of plotting scalar measurements at the $\Gamma_L$ plane for different S-parameter settings (i.e., electrical characterizations) corresponding to different perturbation applications i.e., at the switchable controlled block component, may generate an intersection point that defines the desired $\Gamma_L$. With the derived complex $\Gamma_L$, the accurate measurement of antenna radiated power $P_L$, among others, may be implemented in the device 102.

Although the example scenario 100 illustrates in a limited manner basic components of wireless communications between the devices 102 and 106, other components such as battery, one or more processors, SIM card, etc. were not described in order to simplify the embodiments described herein.

Figure 2:
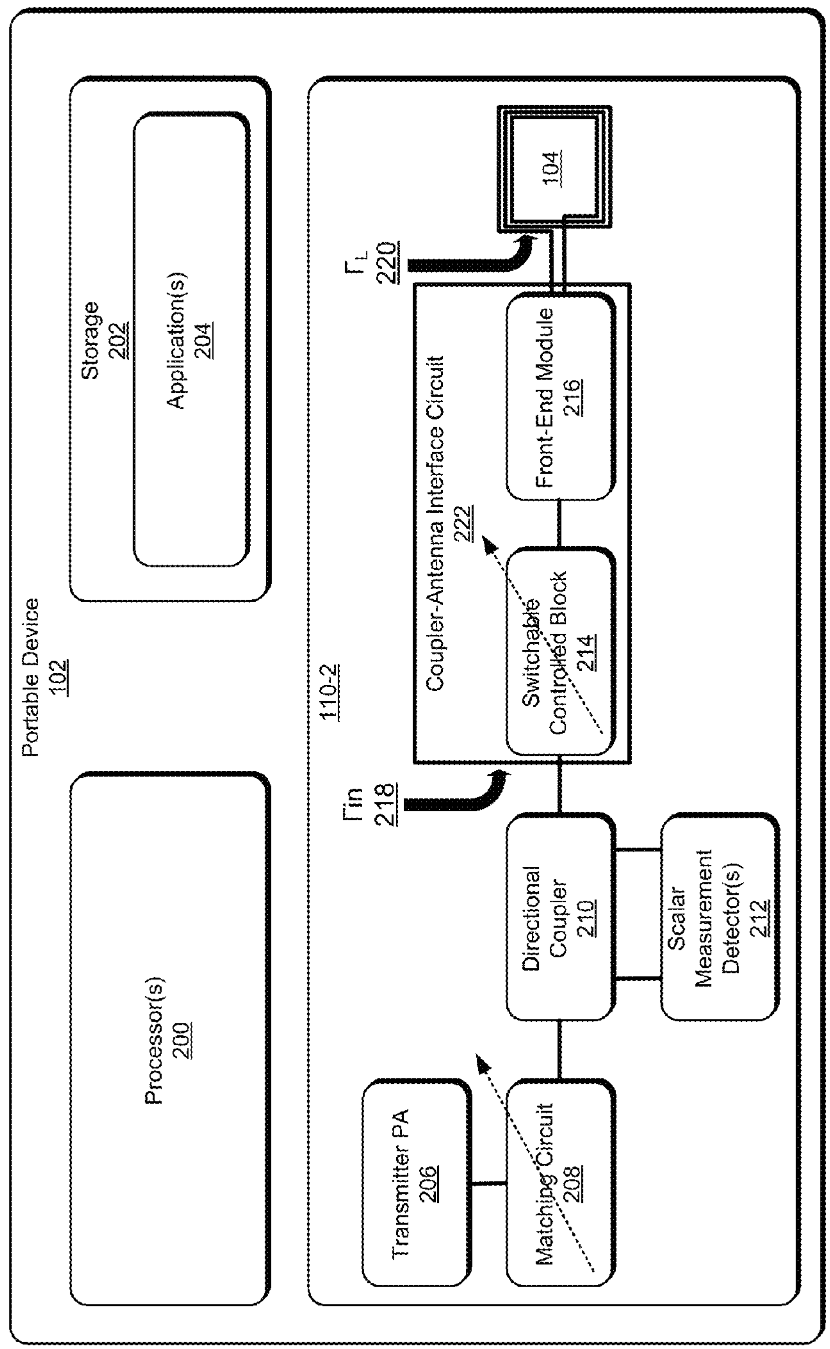
FIG. 2 is an example block diagram of a device as described in present implementations herein.

FIG. 2 illustrates an example block diagram of the device 102 as described in present implementations herein. As shown, the device 102 includes, but is not limited to, processor(s) 200, a storage 202, and applications 204. Furthermore, FIG. 2 shows the transceiver power detection circuitry 110-2 that includes: a transmitter power amplifier (PA) 206; an optional matching circuit 208, a directional coupler (DC) 210; a scalar measurement detector 212; a switchable controlled block component 214; a front-end module 216; and the antenna 104.

Furthermore still, a power reflection coefficient ($\Gamma_{in}$) 218 and a complex antenna load ($\Gamma_L$) 220 are shown at input port and output port, respectively, of a double-port network, which is represented by a coupler-antenna interface circuit 222. As described herein, the coupler-antenna interface circuit 222 may generate different electrical characterizations such as different S-parameter settings for different configurations of the switchable controlled block component 214 and the front-end module 216, which are disposed in between the $\Gamma_{in}$ 218 and the $\Gamma_L$ 220.

As a general overview of the implementations described herein, multiple perturbations of the switchable controlled block component 214 may generate corresponding electrical characterizations (e.g., corresponding S-parameter settings) of the coupler-antenna interface circuit 222. For each S-parameter setting (i.e., after each perturbation application), a scalar measurement may be performed at the $\Gamma_{in}$ 218.

The scalar measurement, which may be represented by a circle with a particular radius on the $\Gamma_{in}$ plane, is subsequently transformed (or inverse mapped) and plotted on the $\Gamma_L$ plane. Assuming that the $\Gamma_L$ 220 remains constant over at least three perturbation applications, an intersection point between at least three plotted circles on the $\Gamma_L$ plane may generate the unknown complex point $\Gamma_L$ or a vector component of the power reflection coefficient $\Gamma_{in}$ as seen at the $\Gamma_{in}$ 218.

With the derived scalar measurement and the unknown complex point $\Gamma_L$, an accurate radiated power measurement at the antenna 104, and an accurate loss measurement between the $\Gamma_{in}$ 218 and the $\Gamma_L$ 220, among others, may be obtained.

The processor 200 may be configured to execute stored instructions or any of a number of applications 204 residing within the storage 202. In this implementation, the processor 200 is configured to control and coordinate the overall operations of the transceiver power detection circuitry 110-2. For example, to implement power measurements at the antenna 104, the processor 200 may run the application 204 that facilitates scalar measurements of the power reflection coefficients based on at least three different S-parameter settings of at least three known values of the front-end module 216; mapping of the derived scalar measurements from the $\Gamma_{in}$ plane to the $\Gamma_L$ plane; and determination of an intersecting point at the $\Gamma_L$ plane;

The storage 202 may include a hard drive, an optical drive, a thumb drive, an array of drives, or any combinations thereof. For example, the storage 202 may include any form of random access memory (RAM), read-only memory (ROM), flash memory, or the like. In this example, the processor 200 may have direct access to the storage 202.

As described in implementations herein, the transceiver power detection circuitry 110-2, which receives control signals from the processor 202, is configured to provide the processor 202 measured data to derive vector measurements as seen at the $\Gamma_L$ 220 and based from the scalar measurements as seen at the $\Gamma_{in}$ 218.

For example, during data transmission, the transmitter PA 206 may be configured to perform linear amplification of modulated signals for transmission through the antenna 104. In this example, the modulated signals passes through the directional coupler 210, the switchable controlled block component 214, and the front-end module 216, before getting transmitted at the antenna 104. Although the directional coupler 210 and the scalar measurement detector 212 are shown to detect and measure scalar measurements at the $\Gamma_{in}$ 218, other circuitries, components, or measuring blocks may be implemented as well without deviating from the implementations described herein.

At high frequency signal transmissions, the directional coupler 210 may be utilized to facilitate scalar measurements through sampling of a forward power and a reflected power along a line that connects, for example, the transmitter PA 206 to the antenna 104. The sampled forward and reflected powers, in this example, is fed to the scalar measurement detector 212 for further processing.

As described herein, the scalar measurement detector 212 may include a hardware in deriving the scalar measurement (e.g., magnitude) of the $\Gamma_{in}$ 218 as seen at the side of the directional coupler 210. For example, the scalar measurement detector 212 may utilize detector circuitries to determine the magnitude of the $\Gamma_{in}$ 218 for the initial setting of the coupler-antenna interface circuit 222 due to a first perturbation application at the switchable controlled block component 214. Based on the measured data (i.e., $\rho_{in}$) from the scalar measurement detector 212, the processor 200 may perform an inverse transform of the measured data (as shown in Equations 3-6 below) to map an equivalent scalar measurement circle from the $\Gamma_{in}$ plane to a circle in the $\Gamma_L$ plane.

$$\Gamma_L = \frac{\Gamma_{in} - S_{11}}{S_{22}\Gamma_{in} - \triangle};\ \triangle = S_{11}S_{22} - S_{12}S_{22} \quad \text{Eq. 3}$$

$$\text{Center}_L = \frac{\overline{\triangle S_{11}} - \rho_{in}^2 \overline{S_{22}}}{|\triangle|^2 - \rho_{in}^2 |S_{22}|^2} \quad \text{Eq. 4}$$

$$\text{radius}_L = \left| \frac{\rho_{in} S_{12} S_{21}}{|\triangle|^2 - \rho_{in}^2 |S_{22}|^2} \right|. \quad \text{Eq. 5}$$

$$\rho_{in} = |\Gamma_{in}| \left( \text{return loss} = -10\log\left(\frac{p_r}{p_f}\right) \right) \quad \text{Eq. 6}$$

where the variable $\Gamma_L$ represents the unknown complex point as seen at the output port side (i.e., $\Gamma_L$ 220); the variables $S_{11}$, $S_{12}$, $S_{21}$, $S_{22}$ represent the known S-parameter settings for a particular perturbation application; the $\rho_{in}$ represents the data or value measured by the scalar measurement detector 212, and the "center$_L$" and "radius$_L$" represent a center and radius, respectively, of a derived circle at the $r_L$ plane.

After plotting the equivalence of the obtained first scalar measurement on the $\Gamma_L$ plane i.e., corresponding to the first perturbation application, the switchable controlled block component 214 is perturbed again to generate a substantially different second S-parameter setting (i.e., second electrical characterization) as compared to the previous S-parameter setting (due to the first perturbation application). With the second perturbation application and using Equations 3-6, a significant change in the second S-parameter setting may facilitate generation of a second substantially different plot at the $\Gamma_L$ plane.

For example, for the second S-parameter setting, the directional coupler 210 is utilized to sample the forward power and the reflected power, and feed the measured sample to the scalar measurement detector 212.

Similar to above operations, the scalar measurement detector 212 may perform a second scalar measurement to obtain, for example, the magnitude of $\Gamma_{in}$ 218 for the second S-parameter setting. The obtained magnitude of the $\Gamma_{in}$ 218 is plotted on the $\Gamma_{in}$ plane using the Equations 3-6 above.

After plotting on the $\Gamma_{in}$ plane the equivalent scalar measurement of the second S-parameter setting, the switchable controlled block component 214 is perturbed for the third time to generate another substantially different third S-parameter setting (i.e., substantially different electrical characterization of the coupler-antenna interface circuit 222). Similarly, the scalar measurement detector 212 performs another scalar measurement for this iteration to obtain, for example, the corresponding magnitude of the third S-parameter setting. As described herein, the substantially different S-parameter setting may include substantially different corresponding plots of each S-parameter setting in the $\Gamma_L$ plane.

With the obtained at least three scalar measurements plotted in the $\Gamma_L$ plane, for example, of the Smith Chart or any other 2-axis plot type, the processor 200 may perform an algorithm to determine the intersection point of the plotted scalar measurements on the $\Gamma_L$ plane. The intersection point, for example, is the unknown complex parameter $\Gamma_L$ or the vector component of the power reflection coefficient $\Gamma_{in}$ within the transceiver power detection circuitry 110.

Based from the derived unknown complex parameter $\Gamma_L$, the matching circuit 208 at the front-end of the transmitter PA 206 may implement a calibration or another impedance adjustment in order to facilitate maximum power transfer in the transceiver power detection circuitry 110-2. Furthermore, the accurate loss measurements between the $\Gamma_{in}$ 218 and the $\Gamma_L$ 220 may allow higher transmitting power without hurting band-edges and/or masks or EVM parameters for FCC certifications.

Although not shown, the switchable controlled block component 214 may include hardware (e.g., inductors, capacitors, control signals, etc.), that facilitates the perturbation application. On the other hand, the front-end module 216 may include a balun, filter, diplexer, and the like, that are connected at the front-end of the antenna 104.

The perturbation application, for example, is not limited to variation of hardware values such as adjustment of varactors, resistors, transformers, or other active elements such as amplifiers in the switchable controlled block component 214. Indeed, another method for achieving three or more perturbations is by using three or more different, but sufficiently close, frequencies (e.g., adjacent Blue Tooth channels) such that the S-parameter setting of the coupler-antenna interface circuit 222 is changed substantially. For example, when a surface acoustic wave (SAW) or a bulk acoustic wave (BAW) filter is utilized in the transceiver power detection circuitry 110, a change in frequency may correspond to a high variation in its S-parameter setting while the $\Gamma_L$ still remains constant.

Figure 3:
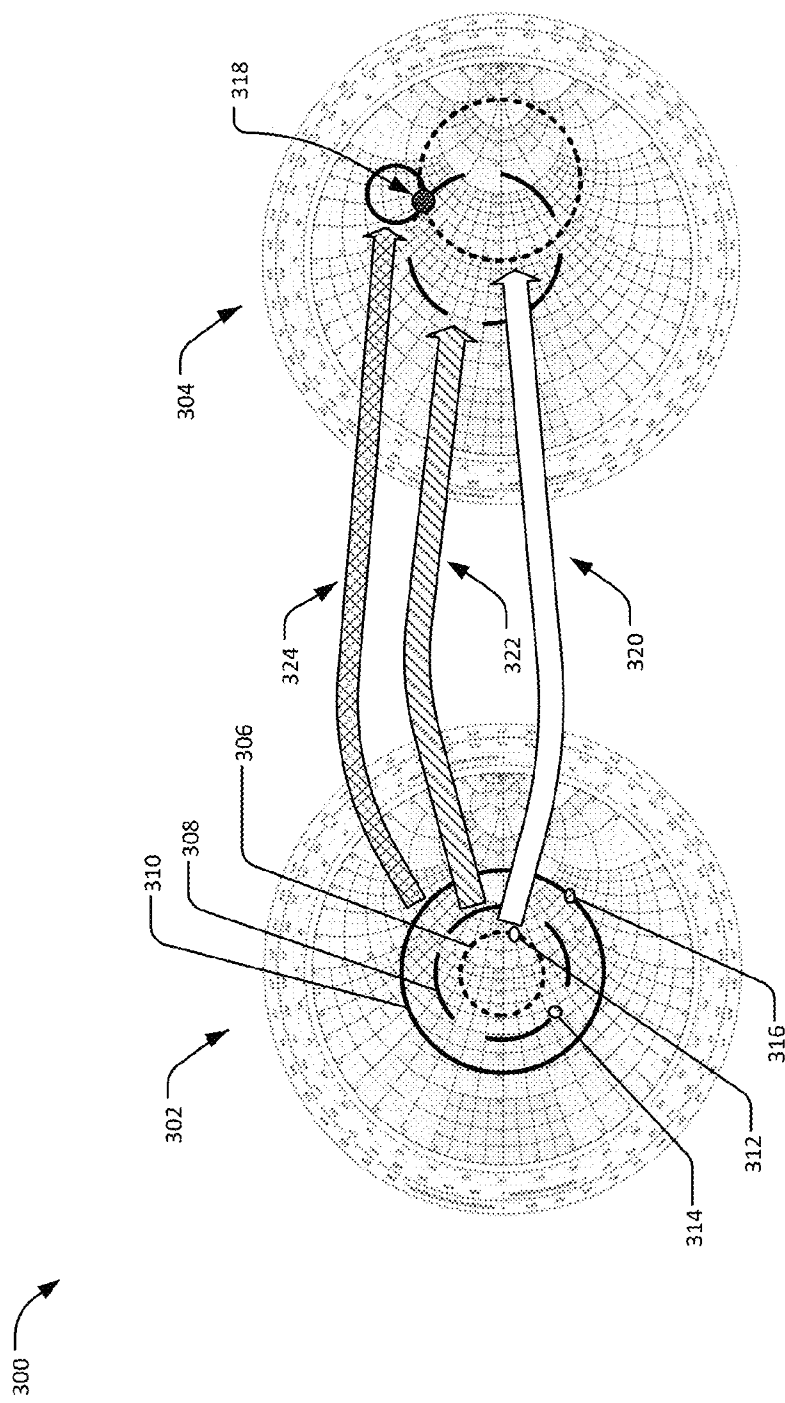
FIG. 3 is an example diagram that illustrates a graphical method of deriving an unknown complex $\Gamma_L$ or a vector measurement based upon mapped scalar measurements as described in present implementations herein.

FIG. 3 illustrates an example diagram 300 that illustrates a graphical method of deriving the unknown complex $\Gamma_L$ or the vector measurement based upon mapped scalar measurements. The diagram 300 illustrates a $\Gamma_{in}$ plane 302 and a $\Gamma_L$ plane 304. Furthermore, the $\Gamma_{in}$ plane 302 shows circles 306, 308, and 310, and their corresponding perimeter points 312, 314, and 316, respectively. Furthermore still, the $\Gamma_L$ plane 304 show an intersection point 318, which is the unknown complex $\Gamma_L$ or the vector measurement that is derived from the plotted scalar measurements in the $\Gamma_{in}$ plane 302.

As described herein, the processor 200 may be configured to utilize Equations 3-6 above in mapping and plotting the derived scalar measurements from the $\Gamma_{in}$ plane 302 into the $\Gamma_L$ plane 304. For example, for three significantly different S-parameter settings (i.e., three different electrical characterizations of the coupler-antenna interface circuit 222), the circles 306-310 are plotted on the $\Gamma_{in}$ plane 302. Using the inverse transformation of Equations 3-6, the processor 200 may transform, map and/or plot the equivalent graphs of the circles 306-310 into the $\Gamma_L$ plane 304 as illustrated by arrows 320-324, respectively.

Assuming that the $\Gamma_L$ remains constant during the scalar measurements for the three different S-parameter settings, the intersection point 318 may be derived from a common point of the plotted equivalent graphs of the circles 306-310 into the $\Gamma_L$ plane 304.

Figure 4:
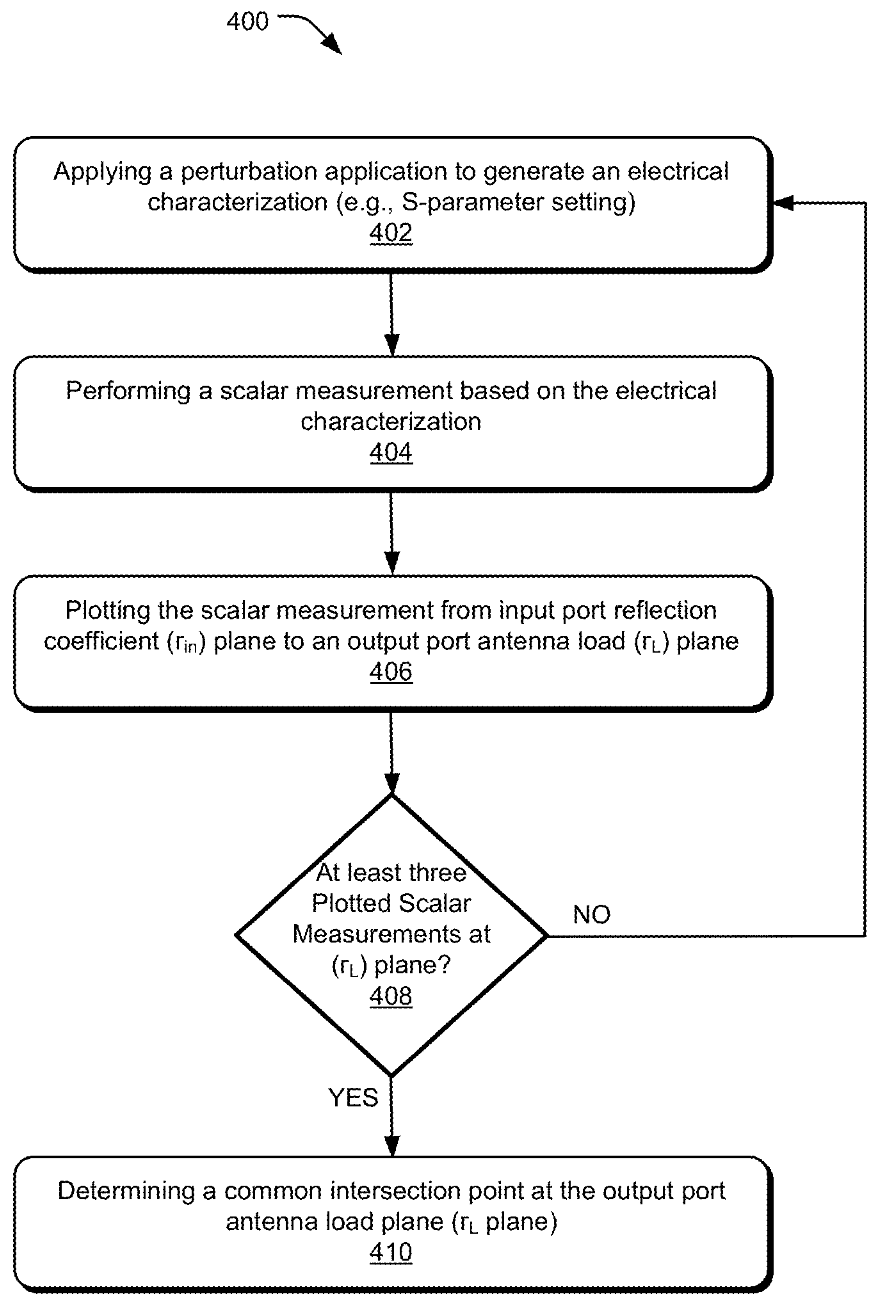
FIG. 4 is an example flow chart illustrating an example method for deriving a vector parameter measurement based from scalar measurements.

FIG. 4 shows an example process chart 400 illustrating an example method for deriving a vector parameter measurement based from scalar measurements. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 402, applying a perturbation application to generate an electrical characterization is performed. For example, a perturbation application on the switchable controlled block component 214 generates an initial electrical characterization (e.g., initial S-parameter setting) of the coupler-antenna interface circuit 222. In this example, the initial S-parameter setting includes a known S-parameter setting of the switchable controlled block component 214 and the front-end module 216.

At block 404, a scalar measurement based on the generated electrical characterization is performed. For example, the directional coupler 210 is configured to sample forward and reflected powers. In this example, the scalar measurement detector 212 determines, for example, the magnitude of power reflection coefficient as seen at the input port $\Gamma_{in}$ 218.

At block 406, plotting the scalar measurement from an input port reflection coefficient plane ($\Gamma_{in}$ plane) to an output port antenna load plane ($\Gamma_L$ plane) is performed. For example, the processor 200 performs an inverse transformation to map and plot the equivalent graph of the scalar measurement from the $\Gamma_{in}$ plane to the $\Gamma_L$ plane.

At block 408, determining number of mapped scalar measurements at the $\Gamma_L$ plane is performed. For example, in a case where there are at least three equivalent scalar measurements that were plotted at the $\Gamma_L$ plane, then at following block 410, a determination of the common intersection point 318 between the at least three plots indicates the vector measurement based from the scalar measurements. Otherwise, another perturbation application at block 402 is performed where the other perturbation application may generate a significant different S-parameter setting as compared to the previous S-parameter setting.

Figure 5:
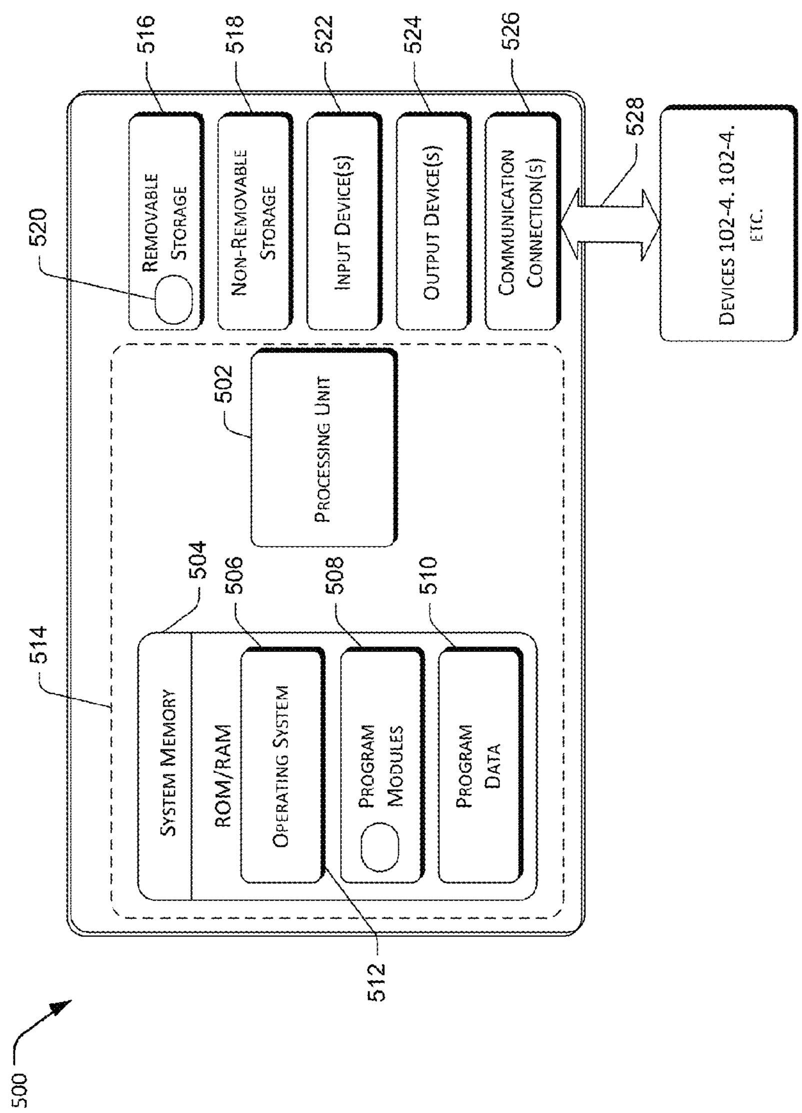
FIG. 5 is an example system that may be utilized to implement transceiver power detection.

FIG. 5 is an example system that may be utilized to implement various described embodiments. However, it will be readily appreciated that the techniques disclosed herein may be implemented in other computing devices, systems, and environments. The computing device 500 shown in FIG. 5 is one example of a computing device and is not intended to suggest any limitation as to the scope of use or functionality of the computer and network architectures.

In at least one implementation, computing device 500 typically includes at least one processing unit 502 and system memory 504. Depending on the exact configuration and type of computing device, system memory 504 may be volatile (such as RAM), non-volatile (such as ROM, flash memory, etc.) or some combination thereof. System memory 504 may include an operating system 506, one or more program modules 508, and may include program data 510. A basic implementation of the computing device 500 is demarcated by a dashed line 514.

The program module 508 may include a module 512. For example, the module 512 may carry out one or more of the method 400, and variations thereof, e.g., the computing device 500 acting as described above with respect to the device 102.

Computing device 500 may have additional features or functionality. For example, computing device 500 may also include additional data storage devices such as removable storage 516 and non-removable storage 518. In certain implementations, the removable storage 516 and non-removable storage 518 are an example of computer accessible media for storing instructions that are executable by the processing unit 502 to perform the various functions described above. Generally, any of the functions described with reference to the figures may be implemented using software, hardware (e.g., fixed logic circuitry) or a combination of these implementations. Program code may be stored in one or more computer accessible media or other computer-readable storage devices. Thus, the processes and components described herein may be implemented by a computer program product. As mentioned above, computer accessible media includes volatile and non-volatile, removable and non-removable media implemented in any method or technology for storage of information, such as computer readable instructions, data structures, program modules, or other data. The terms "computer accessible medium" and "computer accessible media" refer to non-transitory storage devices and include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other non-transitory medium that may be used to store information for access by a computing device, e.g., computing device 500 and wireless mobile device 102. Any of such computer accessible media may be part of the computing device 500.

In one implementation, the removable storage 516, which is a computer accessible medium, has a set of instructions 520 stored thereon. When executed by the processing unit 502, the set of instructions 520 cause the processing unit 502 to execute operations, tasks, functions and/or methods as described above, including method 500 and any variations thereof.

Computing device 500 may also include one or more input devices 522 such as keyboard, mouse, pen, voice input device, touch input device, etc. Computing device 500 may additionally include one or more output devices 524 such as a display, speakers, printer, etc.

Computing device 500 may also include one or more communication connections 526 that allow the computing device 500 to communicate wirelessly with one or more other wireless devices, over wireless connection 528 based on near field communication (NFC), Wi-Fi, Bluetooth, radio frequency (RF), infrared, or a combination thereof.

It is appreciated that the illustrated computing device 500 is one example of a suitable device and is not intended to suggest any limitation as to the scope of use or functionality of the various embodiments described.

Unless the context indicates otherwise, the term "Universal Resource Identifier" as used herein includes any identifier, including a GUID, serial number, or the like.

In the above description of example implementations, for purposes of explanation, specific numbers, materials configurations, and other details are set forth in order to better explain the present invention, as claimed. However, it will be apparent to one skilled in the art that the claimed invention may be practiced using different details than the example ones described herein. In other instances, well-known features are omitted or simplified to clarify the description of the example implementations.

The inventors intend the described example implementations to be primarily examples. The inventors do not intend these example implementations to limit the scope of the appended claims. Rather, the inventors have contemplated that the claimed invention might also be embodied and implemented in other ways, in conjunction with other present or future technologies.

Moreover, the word "example" is used herein to mean serving as an example, instance, or illustration. Any aspect or design described herein as "example" is not necessarily to be construed as preferred or advantageous over other aspects or designs. Rather, use of the word example is intended to present concepts and techniques in a concrete fashion. The term "techniques", for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more", unless specified otherwise or clear from context to be directed to a singular form.

These processes are illustrated as a collection of blocks in a logical flow graph, which represents a sequence of operations that may be implemented in mechanics alone or a combination with hardware, software, and/or firmware. In the context of software/firmware, the blocks represent instructions stored on one or more computer-readable storage media that, when executed by one or more processors, perform the recited operations.

Note that the order in which the processes are described is not intended to be construed as a limitation, and any number of the described process blocks may be combined in any order to implement the processes or an alternate process. Additionally, individual blocks may be deleted from the processes without departing from the spirit and scope of the subject matter described herein.

The term "computer-readable media" includes computer-storage media. In one embodiment, computer-readable media is non-transitory. For example, computer-storage media may include, but are not limited to, magnetic storage devices (e.g., hard disk, floppy disk, and magnetic strips), optical disks (e.g., compact disk (CD) and digital versatile disk (DVD)), smart cards, flash memory devices (e.g., thumb drive, stick, key drive, and SD cards), and volatile and non-volatile memory (e.g., random access memory (RAM), read-only memory (ROM)).

Unless the context indicates otherwise, the term "logic" used herein includes hardware, software, firmware, circuitry, logic circuitry, integrated circuitry, other electronic components and/or a combination thereof that is suitable to perform the functions described for that logic.

The following examples pertain to further embodiments:

In example 1, a transceiver power detection circuitry comprising: a front-end module coupled to an antenna; a switchable controlled block component that is perturbed to generate a different electrical characterization for each perturbation application; and a scalar measurement detector configured to perform a scalar measurement of a power reflection coefficient for each different electrical characterization, wherein the scalar measurement is transformed and plotted from an input port reflection coefficient plane (Γin plane) to an output port antenna load plane (ΓL plane), wherein a vector measurement is based upon a determined intersection point of at least three plotted scalar measurements at the ΓL plane.

Example 2 is the transceiver power detection circuitry of example 1, wherein the perturbation application to generate a substantial change in between electrical characterizations.

Example 3 is the transceiver power detection circuitry of example 2, wherein at least three perturbation applications are performed on the switchable controlled block component to generate at least three substantially different electrical characterizations, which correspond to the at least three plotted scalar measurements at the ΓL plane.

Example 4 is the transceiver power detection circuitry of example 3, wherein a complex antenna load (ΓL) as seen at the antenna remains constant for the generated at least three different electrical characterizations.

Example 5 is the transceiver power detection circuitry of example 1, wherein the plotting at the ΓL plane comprises a calculation of an equivalent center and radius of the derived scalar measurement for each electrical characterization.

Example 6 is the transceiver power detection circuitry of example 1, wherein the perturbation application comprises a change in hardware values.

Example 7 is the transceiver power detection circuitry of example 1, wherein the scalar measurement comprises a magnitude measurement.

Example 8 is the transceiver power detection circuitry of any of examples 1 to 7, further comprising a directional coupler configured to sample a forward power and a reflected power, wherein the scalar measurement is based upon the sampled forward and reflected powers.

In example 9, a device comprising: a processor; a transceiver power detection circuitry coupled to the processor, wherein the transceiver power detection circuitry comprises: a front-end module coupled to an antenna; a switchable controlled block component that is perturbed to generate a different electrical characterization for each perturbation application; and a scalar measurement detector configured to perform a scalar measurement of a power reflection coefficient for each different electrical characterizations, wherein the scalar measurement is transformed and plotted from an input port reflection coefficient plane (Γin plane) to an output port antenna load plane (ΓL plane), wherein a vector measurement is based upon a determined intersection point between at least three plotted scalar measurements at the ΓL plane.

Example 10 is the device of example 9, wherein the perturbation application comprises a substantial change in between the electrical characterizations.

Example 11 is the device of example 10, wherein at least three perturbation applications are performed on the switchable controlled block component to generate the corresponding at least three plotted scalar measurements at the ΓL plane.

Example 12 is the device of example 9, wherein a complex antenna load (ΓL) as seen at the antenna remains constant for the at least three plotted scalar measurements at the ΓL plane.

Example 13 is the device of example 9, wherein the plotting at the ΓL plane comprises a calculation of an equivalent center and radius of the derived scalar measurement for each electrical characterization.

Example 14 is the device of example 9 further comprising a directional coupler configured to sample a forward power and a reflected power, wherein the scalar measurement is based upon the sampled forward and reflected powers.

Example 15 is the device of example 9, wherein the perturbation application comprises a change in hardware values.

Example 16 is the device of any of examples 9 to 15, wherein the scalar measurement comprises a magnitude measurement.

In example 17, a method of estimating complex antenna impedance in a device, the method comprising: applying a perturbation application to generate an electrical characterization; performing a scalar measurement based on the generated electrical characterization; plotting the scalar measurement from an input port reflection coefficient plane (Γin plane) to an output port antenna load plane (ΓL plane); and determining a common intersection point between at least three plotted scalar measurements on the ΓL plane, wherein the at least three plotted scalar measurements correspond to at least three different perturbation applications, wherein a vector measurement is derived from the determined intersection point between the at least three plotted scalar measurements on the ΓL plane.

Example 18 is the method of example 17, wherein the different perturbation applications generate a substantial change in between the generated electrical characterizations.

Example 19 is the method of example 17, wherein a complex antenna load (ΓL) for the at least three plotted scalar measurements remains constant.

Example 20 is the method of example 17, wherein the scalar measurement comprises sampling a forward power and a reflected power to obtain a magnitude of a power reflection coefficient.

Example 21 is the method of example 17, wherein the plotting at the ΓL plane comprises a calculation of an equivalent center and radius of the derived scalar measurement for each electrical characterization setting.

Example 21 is the method of any of examples 17 to 21, wherein the perturbation application comprises a change in frequency or hardware values.

What is claimed is:

1. A transceiver power detection circuitry comprising:

a front-end module coupled to an antenna;

a switchable controlled circuit that is perturbed to generate a different electrical characterization for each perturbation application, the perturbation application comprising a change in frequency or hardware values; and a scalar measurement detector configured to perform a scalar measurement of a power reflection coefficient for each different electrical characterization, wherein the scalar measurement is transformed from an input port reflection coefficient plane to an output port antenna load plane, data points associated with the scalar measurement at the output port antenna load plane are stored, and a vector measurement is derived based upon a determined intersection of the stored data points of at least three scalar measurements at the output port antenna load plane.

2. The transceiver power detection circuitry of claim 1, wherein different perturbation applications generate substantially different electrical characterizations.

3. The transceiver power detection circuitry of claim 2, wherein at least three perturbation applications are performed on the switchable controlled circuit to generate at least three substantially different electrical characterizations corresponding to the at least three scalar measurements at the output port antenna load plane.

4. The transceiver power detection circuitry of claim 3, wherein a complex antenna load as seen at the output port antenna load plane remains constant for the at least three scalar measurements corresponding to three different electrical characterizations.

5. The transceiver power detection circuitry of claim 1, wherein the transformation of the scalar measurement from the input port reflection coefficient plane to the output port antenna load the lane comprises a calculation of an equivalent center and a radius of the detected scalar measurement for each electrical characterization.

6. The transceiver power detection circuitry of claim 1, wherein the scalar measurement comprises a magnitude measurement.

7. The transceiver power detection circuitry of claim 1, further comprising:

a directional coupler configured to sample a forward power and a reflected power, wherein the scalar measurement is based upon the sampled forward and reflected powers.

8. A device comprising:

a processor;

a transceiver power detection circuitry coupled to the processor, wherein the transceiver power detection circuitry comprises:

a front-end module coupled to an antenna;

a switchable controlled circuit that is perturbed to generate a different electrical characterization for each perturbation application, the perturbation application comprising a change in frequency or hardware values; and a scalar measurement detector configured to perform a scalar measurement of a power reflection coefficient for each different electrical characterizations, wherein the scalar measurement is transformed from an input port reflection coefficient plane to an output port antenna load plane, data points associated with the scalar measurement at the output port antenna load plane are stored, and a vector measurement is derived based upon a determined intersection of the stored data points between at least three scalar measurements at the output port antenna load plane.

9. The device of claim 8, wherein different perturbation applications generate substantially different electrical characterizations.

10. The device of claim 9, wherein at least three perturbation applications are performed on the switchable controlled circuit to generate at least three substantially different electrical characterizations corresponding to the at least three scalar measurements at the output port antenna load plane.

11. The device of claim 8, wherein a complex antenna load as seen at the output port antenna load plane remains constant for the at least three scalar measurements.

12. The device of claim 8, wherein the transformation of the scalar measurement from the input port reflection coefficient plane to the output port antenna load plane comprises a calculation of an equivalent center and a radius of the scalar measurement for each electrical characterization.

13. The device of claim 8, wherein the scalar measurement comprises a magnitude measurement.

14. The device of claim 8, further comprising:

a directional coupler configured to sample a forward power and a reflected power, wherein the scalar measurement is based upon the sampled forward and reflected powers.

15. A method of estimating complex antenna impedance in a device, the method comprising:

applying a perturbation application to generate an electrical characterization, by applying a change in frequency or hardware values;

performing a scalar measurement based on the generated electrical characterization;

transforming the scalar measurement from an input port reflection coefficient plane to an output port antenna load plane;

storing data points associated with the scalar measurement at the output port antenna load plane; and determining a common intersection of the stored data points between at least three scalar measurements on the output port antenna load plane, wherein the at least three scalar measurements correspond to at least three different perturbation applications, and a vector measurement is derived from the determined intersection between the at least three scalar measurements at the output port antenna load plane.

16. The method of claim 15, wherein different perturbation applications generate substantially different electrical characterizations.

17. The method of claim 15, wherein a complex antenna load for the at least three scalar measurements remains constant.

18. The method of claim 15, wherein the scalar measurement comprises sampling a forward power and a reflected power to obtain a magnitude of a power reflection coefficient.

19. The method of claim 15, wherein the transformation of the scalar measurement from the input port reflection coefficient plane to the output port antenna load plane comprises a calculation of an equivalent center and a radius of the scalar measurement for each electrical characterization.

* * * * *